United States Patent [19]
Priebe et al.

[11] Patent Number: 6,031,869
[45] Date of Patent: Feb. 29, 2000

[54] USE OF MULTIPLE SAMPLE FREQUENCIES TO RESOLVE AMBIGUITIES IN BAND-FOLDED DIGITAL RECEIVERS

[75] Inventors: Les Priebe; Mark Philip Swenholt, both of Plano; Ronald Persson, Carrollton, all of Tex.

[73] Assignee: Texas Instruments Incorporated, Dallas, Tex.

[21] Appl. No.: 08/947,819

[22] Filed: Oct. 9, 1997

Related U.S. Application Data

[60] Provisional application No. 60/028,834, Oct. 21, 1996.

[51] Int. Cl.$^7$ .............................. H04B 17/00; H03D 3/22
[52] U.S. Cl. ............................................. 375/224; 375/329
[58] Field of Search ..................... 375/224, 232, 375/284, 329, 364; 329/308; 324/76.22, 76.35

[56] References Cited

U.S. PATENT DOCUMENTS

| | | | |
|---|---|---|---|
| 4,910,792 | 3/1990 | Takahata et al. | 455/10 |
| 5,109,188 | 4/1992 | Sanderson et al. | 324/76.35 |
| 5,198,748 | 3/1993 | Tsui et al. | 324/76.35 |
| 5,323,103 | 6/1994 | Choate et al. | 324/76.22 |
| 5,404,375 | 4/1995 | Kroeger et al. | 375/200 |
| 5,566,210 | 10/1996 | Saito et al. | 375/329 |
| 5,602,847 | 2/1997 | Pagano et al. | 370/484 |

*Primary Examiner*—Chi H. Pham
*Assistant Examiner*—Khai Tran
*Attorney, Agent, or Firm*—David Denker; W. James Brady; Richard L. Donaldson

[57] ABSTRACT

A method of resolving the frequency ambiguities which result when the instantaneous bandwidth of a digital receiver exceeds the sampling frequency of the digital to analog converter. The frequency ambiguities which result from sampling an input signal below the Nyquist rate are resolved by simultaneously sampling the signal at multiple sample frequencies and then using a lookup table to identify the unique mapping of the common signal into the multiple sample frequency baselines.

23 Claims, 2 Drawing Sheets

USE OF MULTIPLE SAMPLE FREQUENCIES TO RESOLVE AMBIGUITIES IN BAND-FOLDED DIGITAL RECEIVERS

This application claims priority under 35 USC § 119(e)(1) of provisional application Ser. No. 60/028,834 filed Oct. 21, 1996.

BACKGROUND OF THE INVENTION

1. Field of the Invention

This invention relates to a method of and architecture for obtaining an instantaneous unambiguous bandwidth beyond the analog to digital (A/D) converter sample rate in a digital receiver using current technology A/D converters and, more specifically, to obtaining such a bandwidth by determining the true frequency of an undersampled input signal after it has been mapped into the sample frequency bandwidth.

2. Brief Description of the Prior Art

Traditionally, incoming analog signals which are to be converted to digital signals are sampled at a rate of at least twice the receiver bandwidth in order to satisfy the Nyquist criteria. To achieve wide instantaneous bandwidth, sophisticated high sampling rate A/D converters are required which increase system cost. In many receivers, the information bandwidth of the signals to be processed is much narrower than the instantaneous bandwidth of the receiver, allowing the sample rate to be lowered without violating the Nyquist criteria. The penalty for undersampling (utilizing a sampling rate lower than the Nyquist rate with respect to the receiver instantaneous bandwidth) is aliasing which results in frequency ambiguities. It follows that if signal processing can be provided after sampling to resolve the ambiguities to determine the true carrier frequency of the input signal, then, provided the response bandwidth of the A/D converter is greater than the receiver instantaneous bandwidth, there is no need to sample at twice the receiver instantaneous bandwidth in order to preserve signal integrity. Such processing would permit sampling at much lower rates, thereby making very efficient use of A/D converter bandwidths and materially reducing costs. The frequency ambiguities are caused by the N:1 mapping (band folding) of the receiver instantaneous bandwidth into the sample bandwidth of zero to $F_{sample}/2$ for real sampling and zero to $F_{sample}$ for complex sampling.

It is to be understood that the discussion herein relates primarily to a basic digital receiver architecture as illustrated in FIG. 1 wherein the final intermediate frequency (IF) is discretely sampled (either real or complex) and then digitally processed. This architecture is fundamental to all digital receivers. As can be seen in FIG. 1, the analog RF input is fed to a local oscillator to derive the IF signal, this IF signal being filtered by a filter which limits the bandwidth of the incoming signal, the signal then being converted to a digital signal in an A/D converter having a sampling frequency Fs with the output of the converter sent to a processor for operation thereon. The determination of the signal frequency is a fundamental parameter to be extracted from the RF input signal.

In many digital receivers, the low pass filter preceding the A/D converter limits the signal bandwidth to one half the sample frequency ($F_S/2$) or less. This eliminates any aliased signals but also limits the receiver bandwidth to no more than $F_S/2$ in the case of real sampling and $F_S$ for complex sampling. Band-folded digital receivers open this bandwidth up and use signal processing techniques to estimate the true frequency of the aliased signals. Band-folded digital receivers take advantage of the fact that the input response bandwidth of many A/D converters is many times the sample bandwidth and, therefore, the corner frequency of the low pass filter preceding the A/D converter can be increased up to the response bandwidth of the A/D converter rather than be limited to the sampling frequency ($F_S$). The A/D converter response bandwidth is a function of the input sample and hold circuit therein. As an option, an external sample and hold component can be provided t:o further increase the response bandwidth of a given A/D converter.

James B. Tsui and Richard B. Sanderson have discussed, for the real signal sampling case, a method to resolve the frequency ambiguity by sampling a delayed version of the input signal with a second A/D converter (see U.S. Pat. Nos. 5,099,194, 5,099,243, 5,109,188 and 5,235,287). Tsui and Sanderson document that the aliased frequency ($F_{meas}$) and relative phase of each A/D channel can be measured using a peak detected Fast Fourier Transform (FFT) and the true frequency ($F_{est}$) can be estimated from:

$$F_{est} = \frac{\phi}{2 \cdot \pi \cdot \tau}$$

where ø is the measured phase difference between channels and T is the signal delay. This technique requires that the phase shift on the delayed signal be less than π radians. This estimate is close enough to determine the alias band (n) which can be used to estimate the true frequency (F) from:

$F = F_{meas} + n \cdot F_S.$

Tsui and Sanderson point out that this technique does not work if the input frequency is too close to an alias border or if two signals are degenerate in the lowest alias. These cases are handled by adding a second pair of A/D converters and sampling the data at a different frequency which shifts the input signals away from alias borders and resolves the degenerate case.

James B. Tsui and David L. Sharpin disclose in U.S. Pat. No. 5,198,748 a variation to the above described earlier work by eliminating the second sampling frequency and generating a second pair of IF input signals shifted in frequency by $F_S/4$ from the first pair. Tsui and Sharpin also recognized that the signal delay can be introduced on the sample clock rather than the data, this offering a somewhat simplified architecture. Both techniques described by Tsui and Sanderson require a fixed signal delay and a dø/dt calculation as the prime discriminant for ambiguity resolution. That method requires both a frequency and a phase measurement for ambiguity resolution, whereas the invention herein requires only a frequency measurement, offering potential savings in overall system complexity.

SUMMARY OF THE INVENTION

The problem of resolving ambiguities for input signals near alias borders is resolved in the invention described herein by using complex sampling to eliminate the alias border condition or in the case of real sampling, by introducing a known phase or frequency shift to the input signal. The frequency shift technique is similar to that previously described by Tsui, but the phase shift technique per se is unique herein. Using either approach, the invention herein is distinct from the Tsui technique in that it uses a second sampling frequency to directly resolve the band folded ambiguity and not just to reposition signals away from an alias border.

The present invention provides a unique method and architecture to determine the true frequency of an undersampled input signal after it has been mapped into the sample frequency bandwidth. Frequency measurements from the input signal are used after it has been sampled at multiple sample frequencies as the primary discriminants in both ambiguity resolution and in the estimation of the unambiguous signal frequency. Other approaches require a channel to channel phase and time delay measurement to resolve the ambiguity and a frequency measurement to estimate the unambiguous frequency. Since the present invention uses only the measurement of frequency to resolve the ambiguity and to estimate the unambiguous frequency, it offers potential savings in both hardware and processing time over methods which require both a frequency and a channel to channel phase measurement to accomplish the same task.

Briefly, instantaneous bandwidths in digital receivers are extended beyond the sample frequency of the A/D converters by sampling the data at multiple sample frequencies to resolve the frequency ambiguities that occur as the input bandwidth is extended beyond the sample frequency. The bandwidth of the frequency extension is a function of the input response bandwidth of the A/D converters and the sample frequencies selected for the ambiguity resolution. Downconverting the center of the input bandwidth to zero Hertz and using complex sampling in a band folded receiver reduces the required A/D converter input response bandwidth to one half the desired unambiguous bandwidth. The process is equally applicable to real as well as complex sampled data with a bandwidth penalty for real sampling of 0.5. Accordingly, frequency ambiguities in a band-folded digital receiver are uniquely resolved using multiple sample frequencies with complex (in-phase and quadrature) sampled data. A frequency or a phase shift on the input signal can be used to extend the multiple sampling frequency process to non-complex sampled data. The maximum achievable unambiguous bandwidth when complex sampling is used is equal to the product of the sample frequencies divided by their greatest common multiplier (GCM). For a given set of sample frequencies, the maximum achievable unambiguous bandwidth using real sampling is one half the achievable bandwidth for complex sampling. A baseband frequency measurement resolution of at least one half the greatest common multiplier between the sample frequencies is required. Using multiple sample frequencies to resolve frequency ambiguities in a band-folded digital receiver can be implemented with a lookup table to simplify and speed up the signal processing over techniques which require dø/dt calculation and further corrections.

DESCRIPTION OF THE PREFERRED EMBODIMENT

Figure 1:
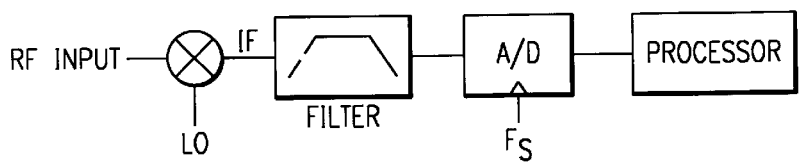
FIG. 1 is a schematic diagram of a typical digital receiver architecture as used in accordance with the present invention.
Figure 2:
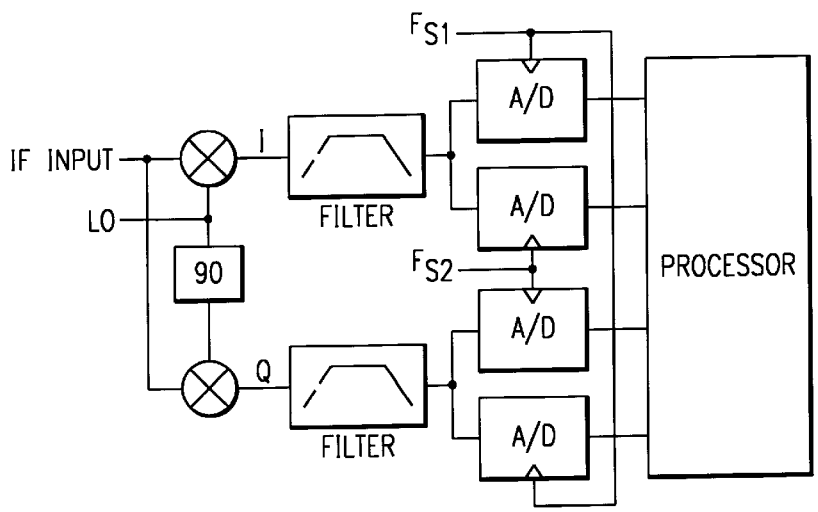
FIG. 2 is a schematic diagram of a band folded digital receiver with I/Q (complex) sampling as used in accordance with the present invention.

The method for resolving the frequency ambiguities in a band folded digital receiver using complex sampling is illustrated in conjunction with FIG. 2. Comparing FIG. 2 with FIG. 1, it can be seen that the IF signal is fed to each of a pair of circuits, one being 90 degrees out of phase with the other to provide an I input in one of the circuit and a Q input to the other circuit. Each of the circuits includes a low pass filter as in FIG. 1, and the output of each filter is passed to a pair of A/D converters in each circuit, one of converters being sampled at a sampling frequency $F_{S1}$ and the other converter being sampled at a sampling frequency $F_{S2}$. The outputs of all of the converters are then processed. The complex sampling eliminates the problem experienced by Tsui et al. when the input signal is near an alias border. This method uses multiple sampling frequencies to directly resolve the frequency ambiguity. By using two sampling frequencies, the aliased signals uniquely map into the sample bandwidth up to a maximum unambiguous frequency give by:

$$F_{unambig(max)} = \frac{F_{S1} \cdot F_{S2}}{GCM}$$

where GCM is the greatest common multiplier between the sample frequencies. The "greatest common multiplier" between two sample frequencies is the largest integer which can be evenly divided into both the sample frequencies. (For example, if the sample rates are 16 and 20 MHz, their greatest common multiplier is 4.) The technique can be extended to N dimensions so the ultimate achievable bandwidth becomes a function not only of the sample frequency but of the frequency measurement accuracy required, the separation of multiple sample frequencies and the input response bandwidth of the A/D converters. The filters shown in FIG. 2 may or may not be present in the receiver, depending upon the IF or RF filtering in the prior stages of the circuit. The filters are shown to illustrate the point that input signal frequencies above the desired unambiguous bandwidth must be removed prior to the A/D conversion.

For the two dimensional case, the frequency ambiguities are resolved in the processor with a lookup table indexed by the base band frequency at each sample rate. The fact that a lookup table can be used to resolve the frequency is unique to this invention and simplifies the signal processing required to resolve the frequency ambiguities. The base band frequency measurement ($F_{meas}$) can be made directly or by use of a FFT or other digital signal processing technique to provide signal processing gain. An integer (M or N) is returned from the lookup table which is used in one of the two following formulas to yield the unambiguous input frequency. The resolution of the calculated value is equal to that of the individual frequency measurements, $$F_{unambig} = M \cdot F_{S1} + F_{meas(FS1)}$$

$$F_{unambig} = N \cdot F_{S2} + F_{meas(FS2)}.$$

Figure 3:
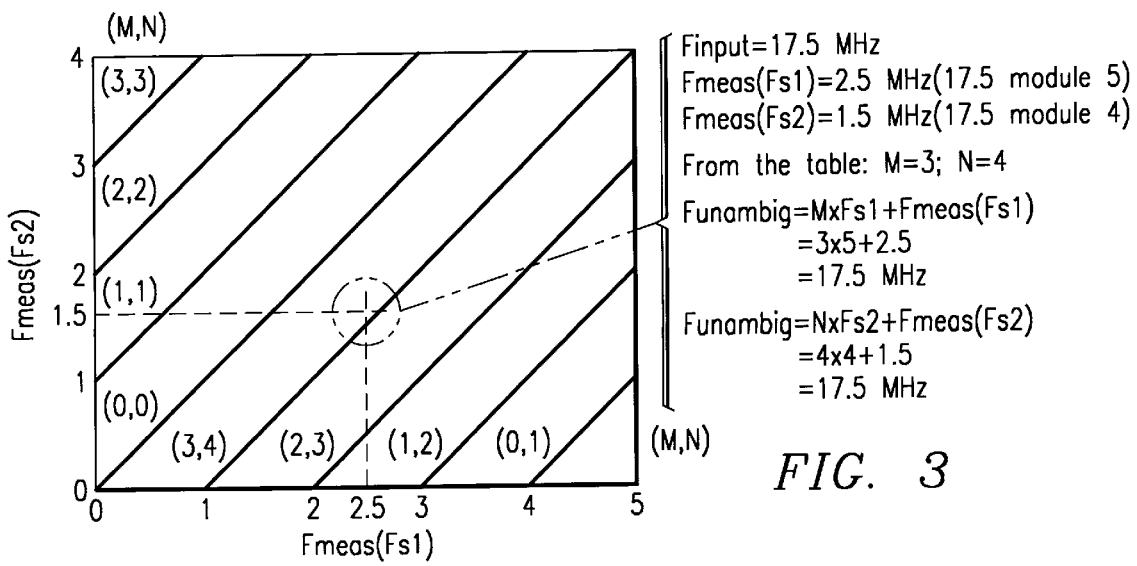
FIG. 3 is a typical 5×4 complex signal ambiguity map as used in accordance with the present invention.

The construction of the lookup table is best understood with reference to an ambiguity map of FIG. 3 identifying the diagonal ambiguity projections. The ambiguity map represents the mapping of the input signal bandwidth into the sample frequency bandwidth of each sample frequency. The ambiguity map is constructed with the sample frequency bandwidth of the first sample frequency along the x axis and the sample frequency bandwidth of the second sample frequency along the y axis. For complex sampling, the sample frequency bandwidth extends from zero to the sampling frequency. Beginning at the origin, all input signal frequencies from zero to the maximum unambiguous frequency are mapped into the spaces defined by the two axes. As the input frequency increases from zero, a diagonal line is traced which projects at 45 degrees upward and to the right. This first line represents an unaliased frequency measurement at both sample frequencies and the frequency measured at each sample frequency would be the same and equal to the frequency of the input signal. This first line is labeled (0, 0) to indicate that the frequency measurement at both sample rates is unaliased. When the input signal frequency is equal to one of the sample rates, the projection reaches a boundary indicating that the frequency measurement along that axis is now aliased. This causes a discontinuity in the projection as the frequency measurement for that axis is reset to zero and the index for the sample rate is incremented to indicate the first alias band. After the discontinuity, the projection continues up and to the right, resetting the measurements on either axis and incrementing the indices as an alias boundary is encountered until the projection eventually retraces itself. This retrace occurs at the maximum unambiguous frequency. The lookup table is a digital representation of this map. In order to insure the correct segment of the projection is located, the resolution of the indices into the table must be less than half the greatest common multiplier of the sample frequencies.

In FIG. 3, sampling frequencies of 5 MHz for $F_{S1}$ and 4 MHz for $F_{S2}$ are used. From the above equation for $F_{unambig}$ (max), the maximum resolvable frequency for this case is 20 MHz. Each projection in the map has two integers (M and N) defined by the numbers in parentheses in FIG. 3 associated therewith with M being the first number and N being the second number. The lookup table need only reference one of these integers. A unique position on the map is identified by the intersection of a vertical projection at $F_{meas(FS1)}$ (vertical dashed line at 2.5 of $F_{meas(FS1)}$) and a horizontal projection at $F_{meas(FS2)}$ (horizontal dashed line at 1.5 of $F_{meas(FS2)}$). The ambiguity projection nearest this intersection gives the required value of M or N to resolve the ambiguity. The ambiguity projections in the map are separated by the GCM which establishes the minimum required frequency resolution at a value less than GCM/2. The further the ambiguity projections are separated or, equivalently, the finer the frequency measurement resolution, the more immune the receiver is to errors in the non-ideal situations of noise and interfering signals. As an example of the utility of the map, an input signal at 17.5 MHz is mapped on each axis in FIG. 3. A 17.5 MHz signal sampled at 5 MHz will indicate an aliased frequency of 2.5 MHz (17.5 modulo 5) and when sampled at 4 MHz the aliased frequency will be 1.5 MHz (17.5 modulo 4). The diagonal projection nearest the intersection on these two values on the map is the projection with indices (3,4). The unambiguous frequency can be calculated using the indicated formulas to verify that the correct frequency is estimated using either of the indices.

It is not a requirement that the receiver front end down convert the input bandwidth to dc, but the most efficient use of the available sampling bandwidth in an A/D converter is accomplished when the desired signal bandwidth is centered around the local oscillator (LO) frequency. In the progression of two sinusoidal signals, one located above the LO frequency ($f_1$) and the second below the LO frequency ($f_2$) as a result of quadrature mixing, the image frequencies are removed, leaving the spectrum of the digitized signal equal, but down converted to that of the composite input signal.

The benefit of this result is that, although the entire input signal bandwidth is preserved in the digitized signal, there are no signal components above a frequency of BW/2 present in the A/D converters where BW is the bandwidth of the receiver. This is significant to the band folded receiver application because the response bandwidth of the A/D converters need only be equal to half the desired unambiguous bandwidth of the receiver.

Figure 4:
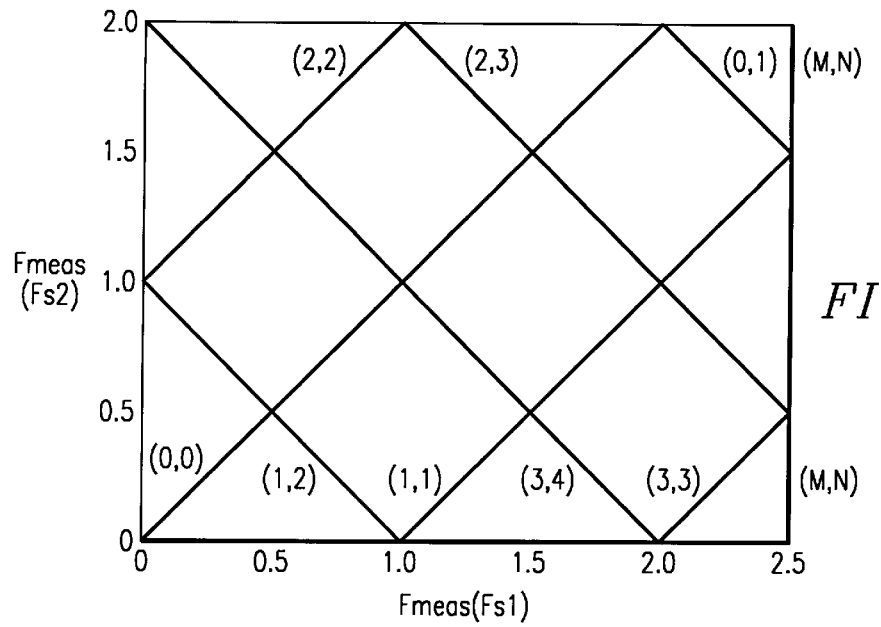
FIG. 4 is a 5×4 real signal ambiguity map as used in accordance with the present invention.

When real, rather than complex, signals are sampled, the same principle of using multiple sample frequencies is applied to resolve the frequency ambiguities which result from band folding. The presence of image signals in the real sampling case reduces the maximum unambiguous bandwidth achievable by a factor of two for a given set of sample frequencies and increases the signal processing necessary to resolve the frequency ambiguities. If the GCM of the sample frequencies remains the same, the required minimum frequency resolution is unchanged from the complex sampling case. Image signals cause a "billiard ball" effect within the ambiguity map for real signals. This is illustrated in FIG. 4 for real input signals at the same sample frequencies as shown in FIG. 3. When the ambiguity projections reach a boundary at either 0 or $F_S/2$, they are reflected at the incident angle rather than reset to zero. This reflection is analogous to the image frequency crossing al $F_S/2$ in the FFT. As the projections reflect, they cross over one another, creating frequency ambiguities which must be resolved by the introduction of additional signal discriminants. In the real signal case, selecting additional sample frequencies increases the achievable bandwidth, but does not resolve the frequency crossovers, which continue to occur as the number of sample frequencies is increased. The frequency crossovers can be resolved by introducing either a frequency or phase shift prior to digital sampling.

Figure 5:
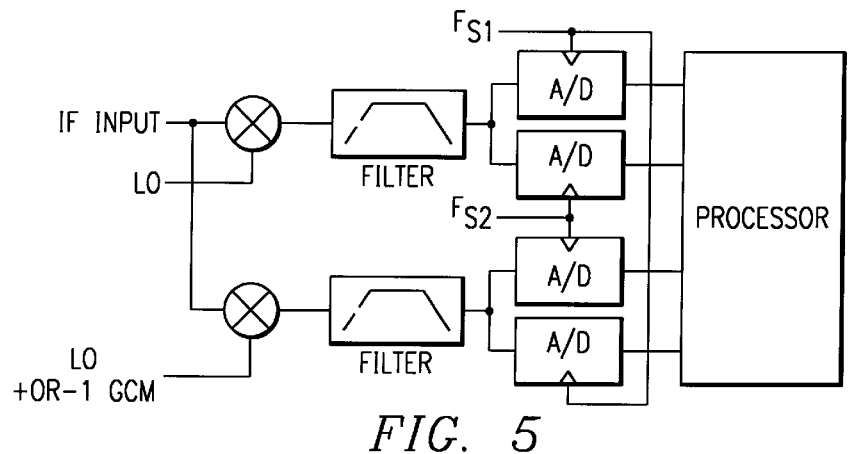
FIG. 5 is a system architecture to resolve ambiguities with real signals using a frequency shift and multiple samp:Le frequencies in accordance with the present invention.

A receiver architecture which resolves the ambiguities in FIG. 4 using a frequency shift in addition to multiple sampling frequencies is shown in FIG. 5. This receiver architecture is the same as in FIG. 2 except that the IF input with no offset is fed to one of the channels (e.g., the channel receiving the I signal in FIG. 2) and the other channel (e.g., the channel receiving the Q signal in FIG. 2) receives the IF input which has been shifted or offset by ±1 GCM. The maximum achievable frequency that can be resolved using this approach is given by:

$$F_{unambig(max)} = \frac{F_{S1} \cdot F_{S2}}{2 \cdot GCM}$$

where the GCM is the greatest common multiplier between the two sample frequencies. In addition to the selection of two sample frequencies, a second pair of samples is required from an input signal which has been shifted plus or minus one GCM from the original signal. This frequency shift causes the usable unambiguous bandwidth to be reduced by one GCM. The crossover ambiguities can be resolved because the two independent measurements linearly project along only one of the two crossover projections in FIG. 4. Once this projection is identified as described hereinbelow, the unambiguous frequency is solved using the appropriate formula from one of the following equations:

$F_{unambig} = M \cdot (F_{S2}/2) + F_{meas(FS1)(M\ even)}$ $F_{unambig} = (M+1)(F_{S1}/2) - F_{meas(FS1)(M\ odd)}$ $F_{unambig} = N \cdot (F_{S2}/2) + F_{meas(FS2)(N\ even)}$ $F_{unambig} = (N+1)(F_{S2}) - F_{meas(FS2)(N\ odd)}$ The ambiguity resolution is accomplished with a lookup table similar to that used for the complex signal case. The only difference between this table and the complex table is that two pairs of indices will be indicated at each address. The address axes represent the measured frequency of the input signal at each sampling frequency. One lookup is required for the zero offset signal and a separate lookup into the same table is required for the GCM offset signal. Because of the frequency crossovers, each lookup must return both indices (M and N) for the nearest two projections in FIG. 4. The projections for the zero offset case return the indices: $M_1$, $N_1$, $M_2$, $N_2$ and the indices for the GCM offset signal are $M'_1$, $N'_1$, $M'_2$, $N'_2$. In all cases, at least one of the offset indices will match one of the zero offset indices and in no case will both pairs of indices match. The matching indices can be used to solve for the unambiguous frequency using the above equations in $F_{unambig}$. For signal cases where the ambiguity is caused by a crossover within the interior of the map, a pair of indices will match and either M or N can be used. For signal ambiguities caused by reflections at a horizontal boundary, only M will match and for ambiguities caused by reflections from a vertical boundary, only N will match. In these cases, only the matching index is used in the correct formula for $F_{unambig}$.

Figure 6:
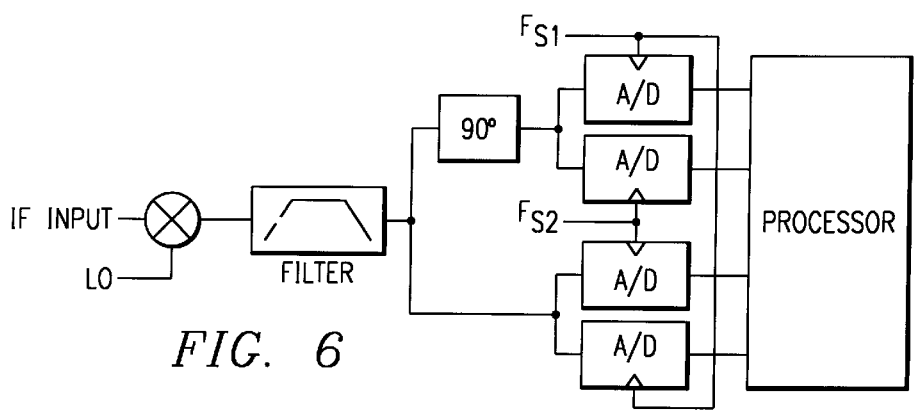
FIG. 6 is a system architecture to resolve ambiguities with real signals using a phase shift and multiple sample frequencies in accordance with the present invention.

A system architecture which resolves the image ambiguities using a phase shift and multiple sample frequencies is shown in FIG. 6. This architecture is similar to that of FIG. 5 except that there is only one input and one filter for both channels with the output of the filter being fed to one pair of A/D converters as in FIG. 5 and also being fed to another pair of A/D converters through a 90 degree phase shifter. The A/D converters are arranged as in FIG. 5. The maximum achievable frequency that can be resolved using this approach is given by the above equation for $F_{uanmbig(max)}$. The 90 degree phase shift in one of the channels at each sample frequency causes the relative phase between the shifted and unshifted channels of an image ambiguity to be 180 degrees out of phase with a non-image ambiguity. This provides one the ability using the map of FIG. 4 to distinguish an odd integer from an even integer as an odd integer ambiguity will have a phase near minus 90° while an even integer ambiguity will have a phase near plus 90°. The projections in FIG. 4 map such that when the indices (M,N) of crossing projections are classified as binary numbers, odd and even, identically labeled indices never cross. The (odd, odd) and (even,even) projections angle to the right and cross the (odd,even) or the (even,odd) projections which angle to the left. Once a look up is made to identify the nearest pair of projections from $f_{meas}$, a delta ($\Delta$) phase measurement will uniquely identify, by its odd/even code, the projection along which the signal is travelling. Once M and N are known, the unambiguous frequency can be solved by the equations in $F_{unambig}$ above.

In all of the above described cases, the outputs of the A/D converters is fed to a processor which, using one of the many known methods, measures the aliased frequency of the signal. These frequency measurements are used in conjunction with a lookup table as discussed above to remove the ambiguities and identify the true input frequency.

It follows that instantaneous bandwidths in digital receivers can be extended beyond the sample frequency of the A/D converters. Sampling of the data at multiple sample frequencies resolves the frequency ambiguities that occur as the input bandwidth is extended beyond the sample frequency. The bandwidth of the frequency extension is a function of the input response bandwidth of the A/D converters and the sample frequencies selected for the ambiguity resolution.

The process is equally applicable to real as well as complex sampled data with a bandwidth penalty for real sampling of approximately 0.5.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A system for resolving frequency ambiguities in a digital receiver having a sampling rate lower than the Nyquist rate which comprises:
   (a) a digital receiver which has a sampling rate lower than the Nyquist rate which includes:
      (i) a first pair of A/D converters for receiving a first common input signal;
      (ii) a second pair of A/D converters for receiving a second common input signal out of phase with said first input signal;
      (iii) a first sampling input to one of said first pair of converters and one of said second pair of converters to sample said one of said first pair of converters and one of said second pair of converters at a first sampling rate lower than the Nyquist rate;
      (iv) a second sampling input to the other of said first pair of converters and the other of said second pair of converters to sample the other of said first pair of converters and said second pair of converters at a second sampling rate lower than the Nyquist rate and different from said first sampling rate; and
   (b) a processor to process the digital outputs of said first and second pairs of converters.

2. The system of claim 1 wherein said first and second sampling rates are integer multiples of rates which are prime to each other.

3. The system of claim 2 further including a first low pass filter with corner frequencies at the response bandwidth of the converter disposed at the input of said first pair of converters and a second low pass filter with corner frequencies at the response bandwidth of the converter disposed at the input of said second pair of converters.

4. The system of claim 2 wherein the frequency of said input to said first pair of converters is shifted by the greatest common multiplier between said first and second sampling rates.

5. The system of claim 2 wherein said first and second common signals are 90° out of phase with each other.

6. The system of claim 3 wherein the frequency of said input to said first pair of converters is shifted by the greatest common multiplier between said first and second sampling rates.

7. The system of claim 3 wherein said first common input signal and said second common input signal are 90° out of phase with each other.

8. The system of claim 1 wherein the frequency of said input to said first pair of converters is shifted by the greatest common multiplier between said first and second sampling rates.

9. The system of claim 1 further including a first low pass filter with corner frequencies at the response bandwidth of the converter disposed at the input of said first pair of converters and a second low pass filter with corner frequencies at the response bandwidth of the converter disposed at the input of said second pair of converters.

10. The system of claim 9 wherein the frequency of said input to said first pair of converters is shifted by the greatest common multiplier between said first and second sampling rates.

11. The system of claim 1 wherein said first and second common signals are 90° out of phase with each other.

12. The system of claim 9 wherein said first common input signal and said second common input signal are 90° out of phase with each other.

13. A method for resolving frequency ambiguities in a converter having a sampling rate lower than the Nyquist rate which comprises the steps of
   (a) providing a digital receiver having a sampling rate lower than the Nyquist rate and having:
      (i) a first pair of A/D converters for receiving a first common input signal;
      (ii) a second pair of AID converters for receiving a second common input signal out of phase with said first input signal;
   (b) sampling one of said first pair of converters and one of said second pair of converters at a first sampling rate lower than the Nyquist rate;
   (c) sampling the other of said first pair of converters and said second pair of converters at a second sampling rate lower than the Nyquist rate and different from said first sampling rate; and
   (e) processing the digital outputs of said first and second pairs of converters to estimate the aliased frequency of an input signal- at each sample rate, and to use the estimate to resolve the true frequency of the input signal.

14. The method of claim 13 wherein said first and second sampling rates are integer multiples of rates which are prime to each other.

15. The method of claim 14 wherein said first and second common signals are 90° out of phase with each other.

16. The method of claim 14 further including the step of low pass filtering input signals at the response bandwidth to said first pair of converters and low pass filtering input signals at the response bandwidth to said second pair of converters.

17. The method of claim 14 wherein the frequency of said input to said first pair of converters is shifted by the greatest common multiplier between said first and second sampling rates.

18. The method of claim 16 wherein the frequency of said input to said first pair of converters is shifted by the greatest common multiplier between said first and second sampling rates.

19. The method of claim 13 further including the step of low pass filtering input signals at the response bandwidth to said first pair of converters and low pass filtering input signals at the response bandwidth to said second pair of converters.

20. The method of claim 19 wherein the frequency of said input to said first pair of converters is shifted by the greatest common multiplier between said first and second sampling rates.

21. The method of claim 5 wherein the frequency of said input to said first pair of converters is shifted by the greatest common multiplier between said first and second sampling rates.

22. The method of claim 13 wherein said first and second common signals are 90° out of phase with each other.

23. A system for resolving frequency ambiguities in a digital receiver having sampling rates lower than the Nyquist rate which comprises:
   (a) a first set of N A/D converters, each of said converters receiving a common input signal;
   (b) a second set of N A/D converters, each of said converters receiving a common input signal which is out of phase with said first input signal;
   (c) first sampling means to sample one of each of said N pairs of converters at a first sampling rate lower than the Nyquist rate;
   (d) N sampling means to sample the other of each of said N pairs of converters at sampling rates lower than the Nyquist rate and different from each other and different from the said first sampling rate; and
   (e) a processor to process the digital outputs of said N pairs of converters.

* * * * *